(12) United States Patent
Kesler et al.

(10) Patent No.: US 7,683,261 B2
(45) Date of Patent: Mar. 23, 2010

(54) ARTICLE AND METHOD FOR PROVIDING A SEAL FOR AN ENCAPSULATED DEVICE

(75) Inventors: James R. Kesler, Pullman, WA (US); Laurence Virgil Feight, Island Lake, IL (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 318 days.

(21) Appl. No.: 11/750,889

(22) Filed: May 18, 2007

(65) Prior Publication Data

US 2007/0267210 A1 Nov. 22, 2007

Related U.S. Application Data

(60) Provisional application No. 60/802,143, filed on May 19, 2006.

(51) Int. Cl.
H02G 15/08 (2006.01)

(52) U.S. Cl. ...................... 174/93; 174/50.57

(58) Field of Classification Search ............. 174/93, 174/50.57
See application file for complete search history.

(56) References Cited

U.S. PATENT DOCUMENTS

| | | | |
|---|---|---|---|
| 2,379,664 A | 7/1945 | Stanko |
| 2,928,048 A | 3/1960 | Postal |
| 2,967,267 A | 1/1961 | Steinman |
| 3,292,579 A | 12/1966 | Buchanan |
| 3,296,493 A | 1/1967 | Whittaker |
| 3,476,997 A | 11/1969 | Otzipka |
| 3,525,903 A | 8/1970 | Morris |
| 3,621,334 A | 11/1971 | Burns |
| 3,676,740 A | 7/1972 | Schweitzer |
| 3,702,966 A | 11/1972 | Schweitzer |
| 3,708,724 A | 1/1973 | Schweitzer |
| 3,715,742 A | 2/1973 | Schweitzer |
| 3,781,682 A | 12/1973 | Schweitzer |
| 3,816,816 A | 6/1974 | Schweitzer |
| 3,866,197 A | 2/1975 | Schweitzer |
| 3,876,911 A | 4/1975 | Schweitzer |
| 3,906,477 A | 9/1975 | Schweitzer |
| 3,972,581 A | 8/1976 | Oldham |
| 3,974,446 A | 8/1976 | Schweitzer |
| 4,029,951 A | 6/1977 | Berry |

(Continued)

OTHER PUBLICATIONS

Radio Faulted Circuit Indicator System by Joslyn Hi-Voltage, www.joslynhivoltage.com, Fisher Pierce 1999.

(Continued)

*Primary Examiner*—Chau N Nguyen
(74) *Attorney, Agent, or Firm*—Eugene M. Cummings, P.C.

(57) ABSTRACT

An article for providing a sealing engagement between an electronic component and an encapsulate material is provided, wherein the electronic component extends from the encapsulate material. The article includes a housing including at least one opening for receiving the electronic component. The housing is filled with an encapsulate material such that it provides a seal between the housing and the electrical component. A sealing member is further disposed between the encapsulate material and the housing. A compression member is provided which exerts force onto the sealing member such that the sealing member engages the encapsulate material to provide a sealing engagement therebetween, and thereby provide a secondary seal between the housing and the electronic component.

22 Claims, 5 Drawing Sheets

U.S. PATENT DOCUMENTS

| | | | |
|---|---|---|---|
| 4,034,360 A | 7/1977 | Schweitzer | |
| 4,038,625 A | 7/1977 | Tompkins | |
| 4,045,726 A | 8/1977 | Schweitzer | |
| 4,063,171 A | 12/1977 | Schweitzer | |
| 4,086,529 A | 4/1978 | Schweitzer | |
| 4,112,292 A | 9/1978 | Varvel | |
| 4,144,485 A | 3/1979 | Akita | |
| 4,165,528 A | 8/1979 | Schweitzer | |
| 4,186,986 A | 2/1980 | Shoemaker | |
| 4,199,741 A | 4/1980 | Serrus Paulet | |
| 4,234,847 A | 11/1980 | Schweitzer | |
| 4,251,770 A | 2/1981 | Schweitzer | |
| 4,288,743 A | 9/1981 | Schweitzer | |
| 4,375,617 A | 3/1983 | Schweitzer | |
| 4,414,543 A | 11/1983 | Schweitzer | |
| 4,424,512 A | 1/1984 | Schweitzer | |
| 4,438,403 A | 3/1984 | Schweitzer | |
| 4,458,198 A | 7/1984 | Schweitzer | |
| 4,495,489 A | 1/1985 | Schweitzer | |
| 4,536,758 A | 8/1985 | Schweitzer | |
| 4,599,487 A | 7/1986 | Blank | |
| 4,626,721 A * | 12/1986 | Ouchi | 310/71 |
| 4,686,518 A | 8/1987 | Schweitzer | |
| 4,689,752 A | 8/1987 | Fernandes | |
| 4,709,339 A | 11/1987 | Fernandes | |
| 4,794,332 A | 12/1988 | Schweitzer | |
| 4,795,982 A | 1/1989 | Schweitzer | |
| 4,829,298 A | 5/1989 | Fernandes | |
| 4,940,976 A | 7/1990 | Gastouniotis | |
| 4,996,624 A | 2/1991 | Schweitzer | |
| 5,008,651 A | 4/1991 | Schweitzer | |
| 5,038,246 A | 8/1991 | Durivage | |
| 5,070,301 A | 12/1991 | Schweitzer | |
| 5,089,928 A | 2/1992 | Durivage | |
| 5,136,457 A | 8/1992 | Durivage | |
| 5,136,458 A | 8/1992 | Durivage | |
| 5,150,361 A | 9/1992 | Wieczorek | |
| 5,153,565 A | 10/1992 | Schweitzer | |
| 5,168,414 A | 12/1992 | Horstmann | |
| 5,196,682 A | 3/1993 | Englehardt | |
| 5,220,311 A | 6/1993 | Schweitzer | |
| 5,298,894 A | 3/1994 | Cerney | |
| 5,420,502 A | 5/1995 | Schweitzer | |
| 5,438,329 A | 8/1995 | Gastouniotis | |
| 5,495,239 A | 2/1996 | Ouellete | |
| 5,519,527 A | 5/1996 | Panton | |
| 5,542,856 A | 8/1996 | Wood | |
| 5,550,476 A | 8/1996 | Lau | |
| 5,565,783 A | 10/1996 | Lau | |
| 5,648,726 A | 7/1997 | Le | |
| 5,656,931 A | 8/1997 | Lau | |
| 5,659,300 A | 8/1997 | Dresselhuys | |
| 5,677,623 A | 10/1997 | Schweitzer | |
| 5,677,678 A | 10/1997 | Schweitzer | |
| 5,701,121 A | 12/1997 | Murdoch | |
| 5,704,799 A * | 1/1998 | Wood | 439/281 |
| 5,793,214 A | 8/1998 | Wakamatsu | |
| 5,821,869 A | 10/1998 | Schweitzer | |
| 5,825,303 A | 10/1998 | Bloss | |
| 5,877,703 A | 3/1999 | Bloss | |
| 5,889,399 A | 3/1999 | Schweitzer | |
| 6,002,260 A | 12/1999 | Lau | |
| 6,014,301 A | 1/2000 | Schweitzer | |
| 6,016,105 A | 1/2000 | Schweitzer | |
| 6,029,061 A | 2/2000 | Kohlschmidt | |
| 6,072,405 A | 6/2000 | Sears | |
| 6,078,785 A | 6/2000 | Bush | |
| 6,133,724 A | 10/2000 | Schweitzer | |
| 6,177,883 B1 | 1/2001 | Jannetti | |
| 6,188,216 B1 | 2/2001 | Fromer | |
| 6,239,722 B1 | 5/2001 | Colton | |
| 6,326,905 B1 | 12/2001 | Walters | |
| 6,349,248 B1 | 2/2002 | Dean | |
| 6,366,217 B1 | 4/2002 | Cunningham | |
| 6,380,733 B1 | 4/2002 | Apel | |
| 6,414,605 B1 | 7/2002 | Walden | |
| 6,429,661 B1 | 8/2002 | Schweitzer | |
| 6,433,698 B1 | 8/2002 | Schweitzer | |
| 6,479,981 B2 | 11/2002 | Schweitzer | |
| 6,525,504 B1 | 2/2003 | Nygren | |
| 6,573,707 B2 | 6/2003 | Kiriyama | |
| 6,577,608 B1 | 6/2003 | Moon | |
| 6,617,976 B2 | 9/2003 | Walden | |
| 6,671,824 B1 | 12/2003 | Hyland | |
| 6,736,646 B2 | 5/2004 | Takahashi | |
| 6,753,792 B2 | 6/2004 | Bechwth | |
| 6,759,933 B2 | 7/2004 | Fallak | |
| 6,796,821 B2 | 9/2004 | Cairns | |
| 6,798,211 B1 | 9/2004 | Rockwell | |
| 6,828,906 B2 | 12/2004 | Malcolm | |
| 6,944,555 B2 | 9/2005 | Blackett | |
| 7,391,299 B2 | 6/2008 | Bender | |
| 2002/0089802 A1 | 7/2002 | Beckwth | |
| 2003/0040897 A1 | 2/2003 | Murphy | |
| 2003/0119568 A1 | 6/2003 | Menard | |
| 2003/0153368 A1 | 8/2003 | Bussan | |
| 2003/0174067 A1 | 9/2003 | Soliman | |
| 2003/0178290 A1 | 9/2003 | Schilling | |
| 2003/0179149 A1 | 9/2003 | Savage | |
| 2004/0005809 A1 | 1/2004 | Suzuki | |
| 2004/0032340 A1 | 2/2004 | Lingafeldt | |
| 2004/0036478 A1 | 2/2004 | Logvinov | |
| 2004/0067366 A1 | 4/2004 | Gorczyca | |
| 2004/0113810 A1 | 6/2004 | Mason | |
| 2004/0214616 A1 | 10/2004 | Malcom | |
| 2004/0233159 A1 | 11/2004 | Badarneh | |
| 2005/0040809 A1 | 2/2005 | Uber | |
| 2005/0068193 A1 | 3/2005 | Osterloh | |
| 2005/0068194 A1 | 3/2005 | Schleich | |
| 2005/0079818 A1 | 4/2005 | Atwater | |
| 2005/0087599 A1 | 4/2005 | Ward | |
| 2005/0110656 A1 | 5/2005 | Patterson | |
| 2005/0132115 A1 | 6/2005 | Leach | |
| 2005/0151659 A1 | 7/2005 | Donovan | |
| 2005/0163432 A1 | 7/2005 | Montena | |
| 2005/0205395 A1 | 9/2005 | Dietrich | |
| 2005/0215280 A1 | 9/2005 | Twitchell, Jr | |
| 2006/0084419 A1 | 4/2006 | Rocamora | |
| 2007/0179547 A1 | 8/2007 | Armstrong | |

OTHER PUBLICATIONS

Fisher Priece Division of Pacific Scientific—Faulted Circuit Indicators—Technical Applications Data 1995; Anh Le, Dave Donovan, Bill Doherty.

Power Mangement Using the Embedded Stand-Alone Wake-Up Protocol. Rev. 2 (Aug. 2002); ATMEL AT86RF211.

Fisher Pierce—Radio Faulted Circuit Indicator System—(1999)—Joslyn Hi-Voltage http://www.joslynhivoltage.com/PDFFiles/RFCI.pdf.

* cited by examiner

ARTICLE AND METHOD FOR PROVIDING A SEAL FOR AN ENCAPSULATED DEVICE

CROSS-REFERENCE TO RELATED APPLICATIONS

This application claims benefit under 35 U.S.C. § 119(e) of U.S. Provisional Application entitled "AN APPARATUS AND METHOD FOR PROVIDING A SEAL FOR AN ENCAPSULATED DEVICE," filed on May 19, 2006, having Ser. No. 60/802,143, naming James R. Kesler and Laurence Virgil Feight as inventors, the complete disclosure thereof being incorporated by reference.

FIELD OF THE INVENTION

The present invention relates generally to an article and method for providing a sealing engagement, and more particularly to an article and method for providing a seal for an encapsulated device.

DESCRIPTION OF THE PRIOR ART

Power transmission and distribution systems may include power system protective, monitoring, and control devices such as protective relays, faulted circuit indicators, and the like. Throughout, the term "power system device" will include any power system protective, monitoring, or control device. Power system device may also be used herein to describe any device associated with devices which protect, monitor or control power systems. For example, faulted circuit indicators and radio interface units associated therewith may be considered a power system device.

Faulted circuit indicators (FCIs) play a vital role in detecting and indicating faults and locations of faulted conductors to decrease the duration of power outages and improve the reliability of power systems throughout the world. Electrical utilities depend on faulted circuit indicators to help their employees quickly locate faulted conductors. Most conventional faulted circuit indicators utilize a mechanical target or an LED to provide a visual indication of a faulted conductor. By visually scanning faulted circuit indicators located at a site, an electrical utility crew can quickly locate a fault. Industry statistics indicate that faulted circuit indicators reduce fault location time by 50%-60% versus the use of manual techniques, such as the "refuse and sectionalize" method. Nonetheless, electrical utilities still spend substantial amounts of time and money determining the locations of faults on their networks.

Electrical utilities rely on a number of additional techniques to further decrease time spent locating faults. For instance, modern faulted circuit indicators frequently have one or more contact outputs that activate on the detection of a fault. These contact outputs can be connected to a Supervisory Control and Data Acquisition ("SCADA") system, allowing remote monitoring of a given faulted circuit indicator's status. This technique works well for above-ground sites, where a cable from the faulted circuit indicator to a monitoring device can be installed, and the monitoring device can be connected to a remote site by a communications line. However, this technique is expensive for underground sites where an underground communications line must be installed.

Another recent advancement is the use of radio frequency ("RF") technology within faulted circuit indication systems. In one prior art system, each faulted circuit indicator communicates with a radio interface unit which communicates the occurrence of a fault to an external receiver. The radio interface unit is often located in proximity to an FCI within an underground vault, which is susceptible to external elements. For example, vaults may often be filled with water thereby exposing the radio interface unit located therein to also be exposed to such. In another example, for overhead FCI systems, radio interface units are also exposed to the external elements as they are situated in proximity to the overhead FCI device.

Prior art arrangements of radio interface units typically include a housing filled with an encapsulate material, which is used to environmentally harden the electronic components. Encapsulate material provides a physical barrier around the electronic components. This barrier is malleable, providing increased resistance to shock and vibration. In addition, if the material is properly cured, the barrier will be water-tight.

One such encapsulate material is referred to as potting material. Potting material may include epoxy based materials, urethane based materials, silicone based materials, acrylic based materials, polyester based materials, and others. Urethane and silicone based materials are the types used most often in the electronics industry. Each particular type of potting material has its own strengths and weaknesses.

Ideally, for radio interface units, all electronic components will be completely encapsulated within a water-tight material. However, some components (e.g., cabling, an antenna, etc.) must extend from the encapsulate material to the external environment to facilitate communication with external electronic apparatuses.

In prior art arrangements, the encapsulate material deteriorates due to aging and its own exposure to the elements. This deterioration may be due to thermal cycling or other causes. Deterioration results in the encapsulate material pulling away from the components which extend from the encapsulate material, thereby exposing these components to the external environment. Deterioration can be exacerbated by dissimilar coefficient of thermal expansion of the materials used for polymer housing and the potting compound, which may result in separation and water ingress.

Accordingly, it is an object of the invention to provide a secondary seal when the encapsulate material begins to pull away from the components which extend from inside the encapsulate material.

SUMMARY OF THE INVENTION

The object of this invention is accomplished by a novel arrangement of encapsulate material. An article for providing a sealing engagement between an electronic component and an encapsulate material is provided, wherein the electronic component extends from the encapsulate material. The article includes a housing including at least one opening for receiving the electronic component. The housing is filled with an encapsulate material such that it provides a seal between the housing and the electronic component. A sealing member is further disposed between the encapsulate material and the housing. A compression member is provided which exerts force onto the sealing member such that the sealing member engages the encapsulate material to provide a sealing engagement therebetween, and thereby provide a secondary seal between the housing and the electronic component.

In accordance with another aspect of the invention, a method for providing a sealing engagement between an electronic component and an encapsulate material is provided. The method includes the steps of inserting the electronic component into the opening of the housing, filling the housing with an encapsulate material such that the encapsulate material provides a sealing engagement between the electronic component and the housing, disposing a sealing member in relation to the encapsulate material such that the sealing member provides a seal between the encapsulate material and the housing, and exerting force onto the sealing member to improve the engagement between the encapsulate material and the electronic component.

BRIEF DESCRIPTION OF THE DRAWINGS

Although the characteristic features of this invention will be particularly pointed out in the claims, the invention itself and the manner in which it can be made and used, can be better understood by referring to the following description taken in connection with the accompanying drawings forming a part hereof, wherein like reference numerals refer to like parts throughout the several views and in which:

DETAILED DESCRIPTION OF THE ILLUSTRATED EMBODIMENT

Figure 1:
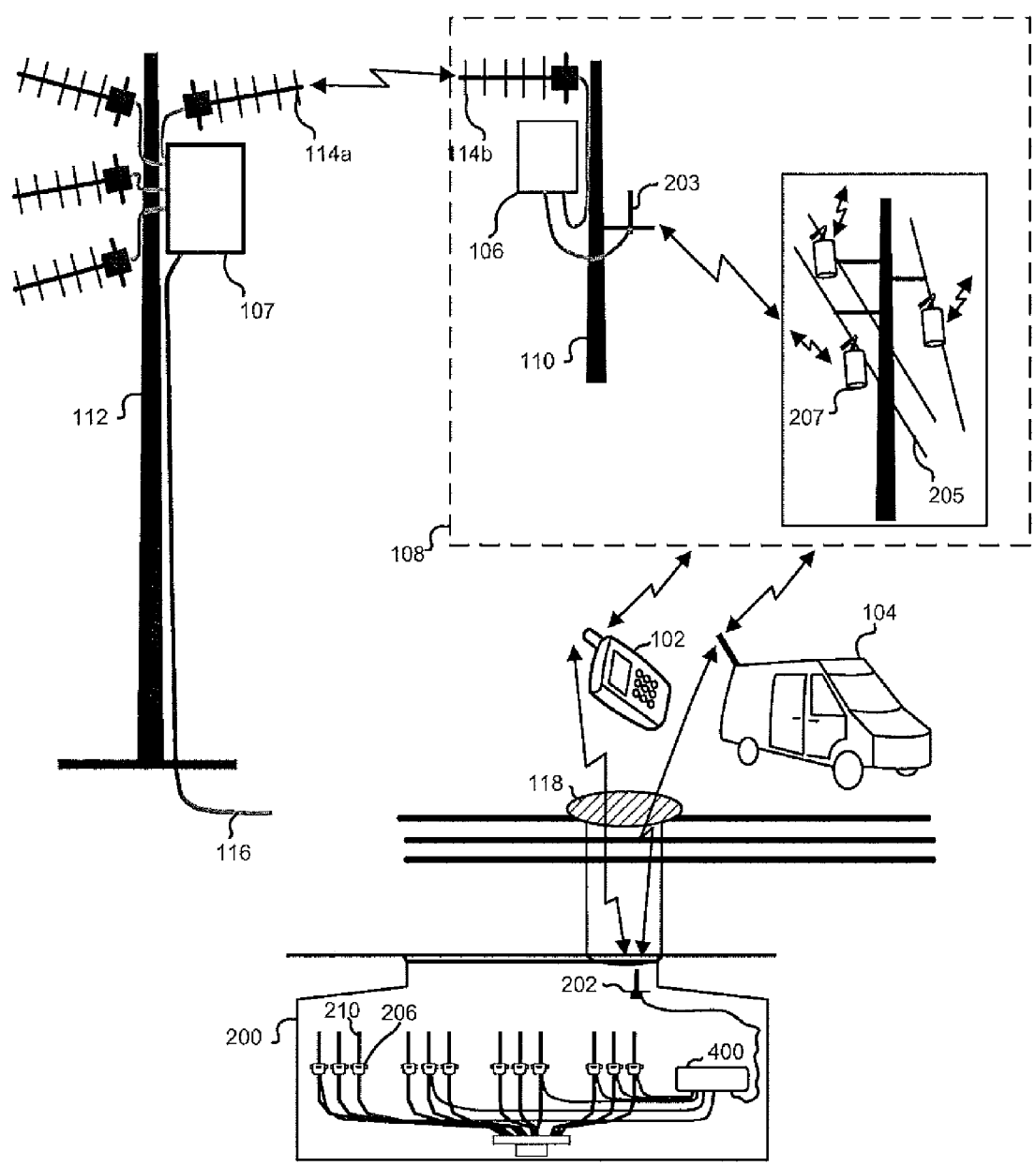
FIG. 1 illustrates a system view of a faulted circuit indicator monitoring system in accordance with an aspect of the present invention.

FIG. 1 illustrates a faulted circuit indicator monitoring system. A number of overhead faulted circuit indicators 207 each contain a two-way radio that communicates the occurrence of a fault via a short range antenna 203 to a local site 110 having an intelligent module 106 installed near the faulted circuit indicators 207. The intelligent module then uses the existing wired telephone network (not shown) or a long range RF antenna 114b to communicate the fault occurrence to a remote site 112 via another long range RF antenna 114a. The remote site 112 includes a remote intelligent module 107, which is connected to another site (not shown) via a wired connection 116. When a fault is detected by a faulted circuit indicator, the occurrence is relayed in the manner described above to the remote site 112, triggering the dispatch of a team to the fault site. The fault team then uses a wireless handheld device 102 or equipment installed in a vehicle 104 to determine precisely which conductor 205 is faulted.

Note that the conductors could also be located in an underground vault 200, which may be generally accessible through a manhole 118. As discussed above, the underground vault 200 is often susceptible to external elements and even flooding. Accordingly, its contents are also susceptible to external elements such as water. Faulted circuit indicators 206 attached to the underground conductors are wired to a radio interface unit 400. The electronic components of the radio interface unit 400 are encapsulated by an encapsulate material such as potting material.

Figure 2:
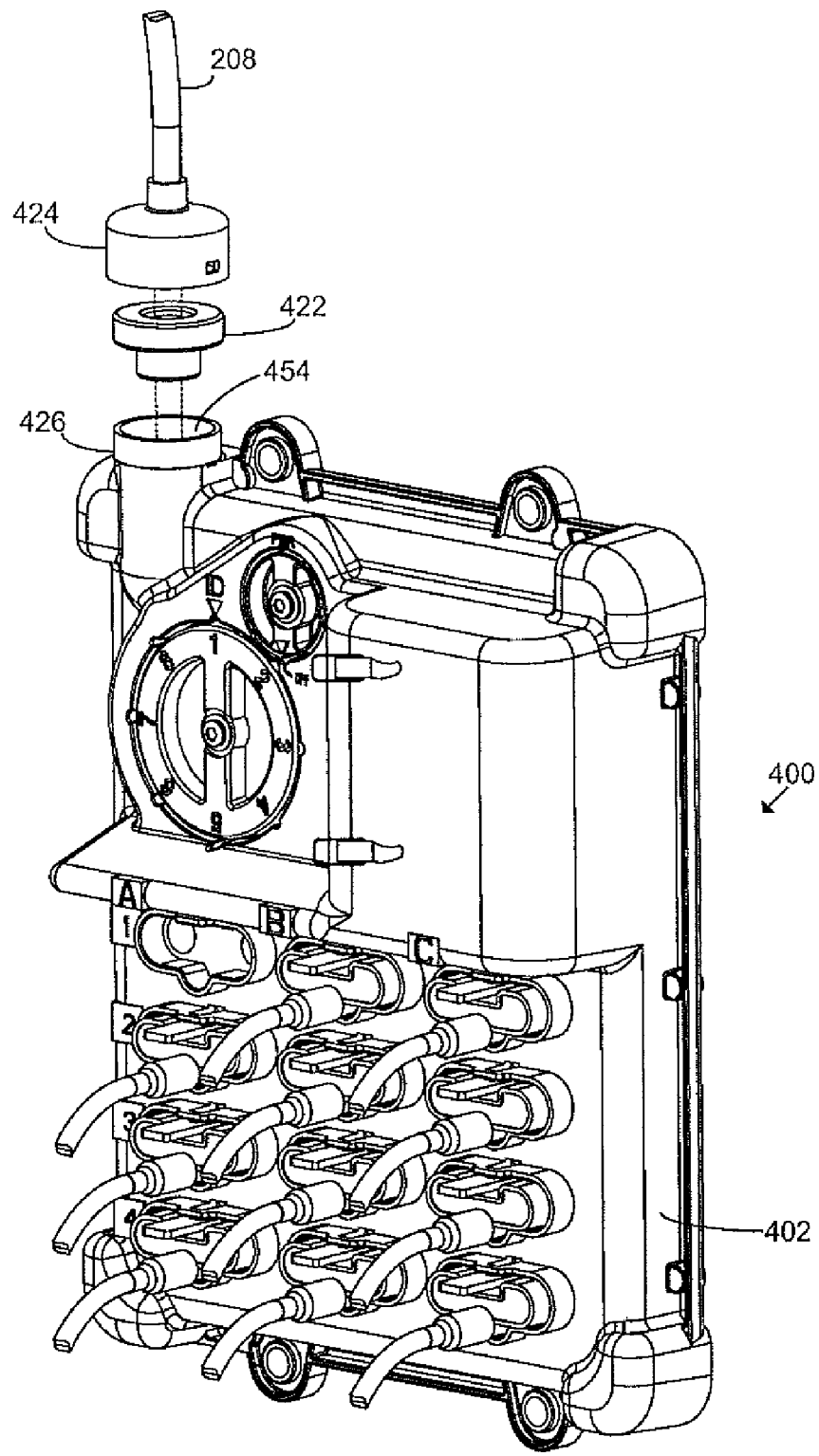
FIG. 2 illustrates an exploded system view of the sealing engagement in accordance with an aspect of the present invention.

As discussed above, some electronic components must extend from inside the encapsulate material to the external environment to facilitate communication with external electronic apparatuses. For example, as illustrated in FIG. 2, a cable 208 is one such electronic component and is shown to connect the radio interface unit 400 to a separate short range antenna 202 (shown in FIG. 1). This arrangement further allows for communication with the wireless handheld device 102 or equipment installed into a vehicle 104.

Figure 3:
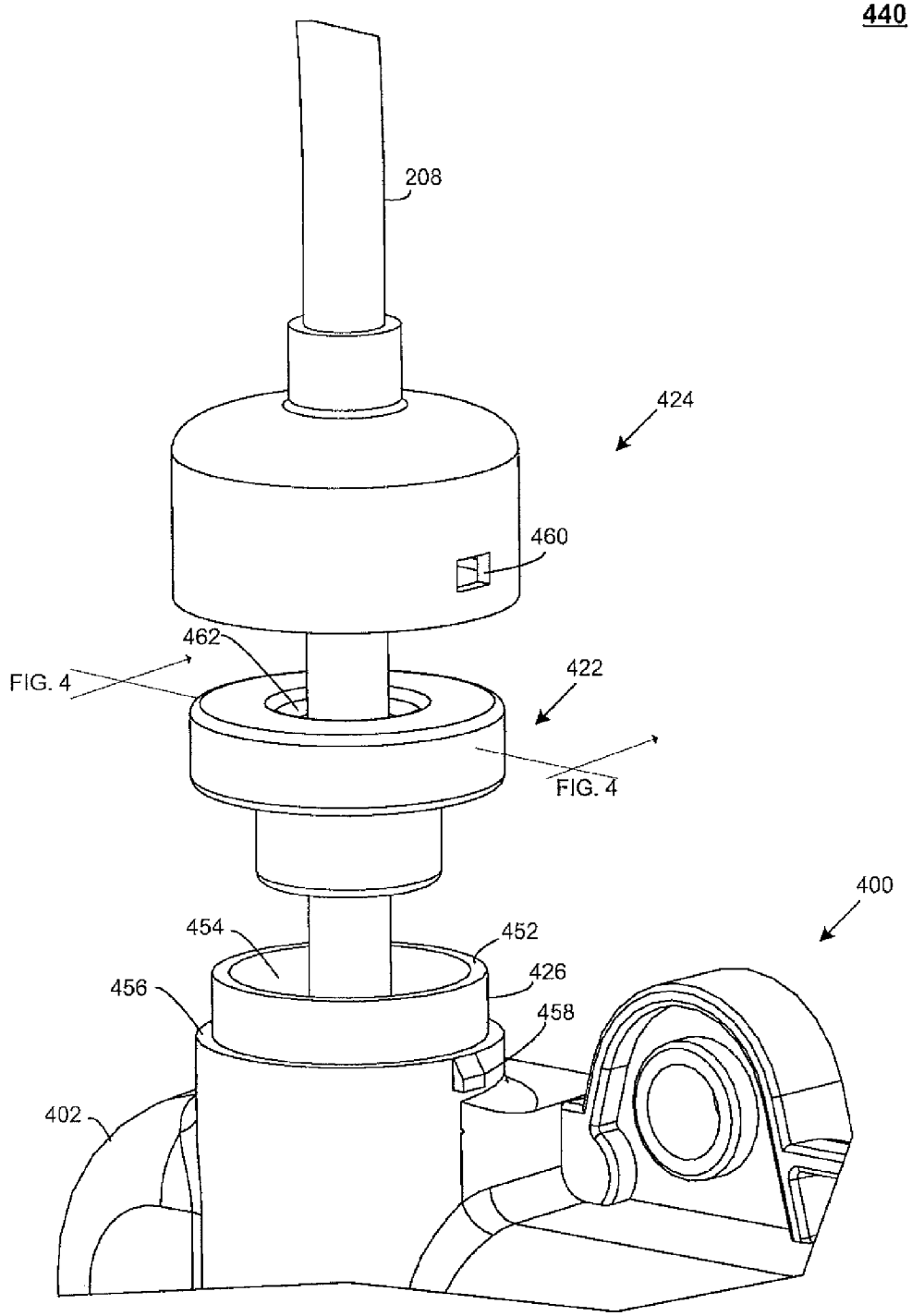
FIG. 3 illustrates a detailed exploded system view of the sealing engagement of FIG. 2.

Referring to FIGS. 2-3, the radio interface unit 400 includes a housing 402. Electronic components, such as internal electrical circuitry, (not shown) are placed within the housing 402. The housing 402 includes an aperture 454 for receiving a cable 208. As described with respect to FIG. 1, the cable connects the radio interface unit 400 to a separate short range antenna 202. The housing 402 is generally filled with an encapsulate material such as potting material. The encapsulate material is allowed to cure, thereby protecting to the internal electronic components (e g., internal electrical circuitry) and providing a seal between the housing 402 and the cable 208.

As discussed above, the encapsulate material often deteriorates due to aging and its own exposure to the elements. In effect, the encapsulate material begins to pull away from the cable over time, which exposes the internal electronic components connected thereto to external elements such as water.

In order to prevent this exposure, a sealing member 422 is disposed between a portion of the encapsulate material and the cable before the encapsulate material cures. In order to effect a seal, the sealing member 422 is positioned such that it engages the housing 402 near the opening 454 for receiving the cable. After the encapsulate material cures, a compression member 424 is further provided to exert a force onto the sealing member 422 such that the sealing member 422 engages a portion of the encapsulate material to provide a sealing engagement therebetween. The compression member 424 may further include at least one coupling opening 460 which corresponds to and engages with latch 458 to secure the compression member 424 onto the housing 402.

Figure 4:
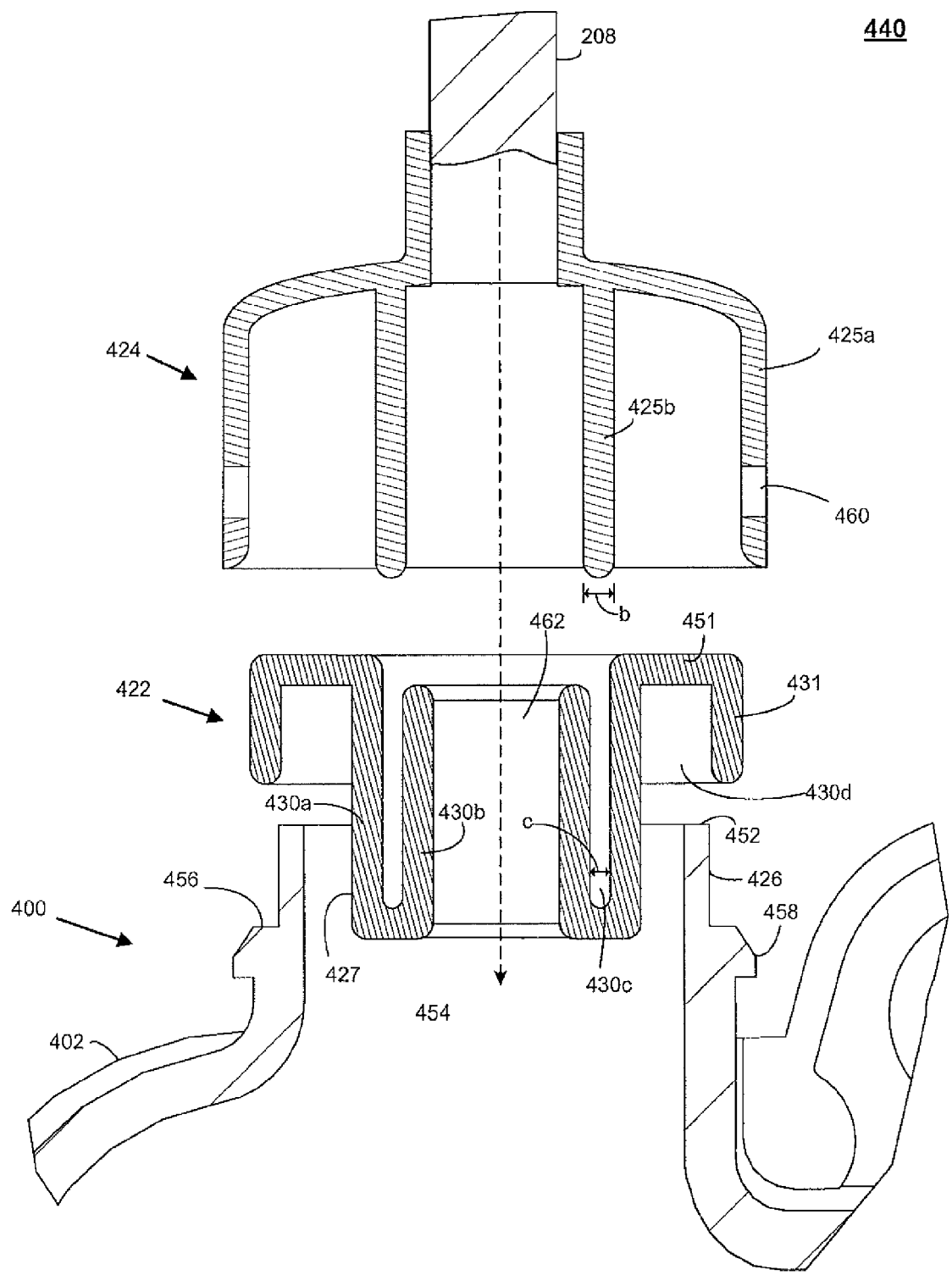
FIG. 4 illustrates a cross-sectional, exploded view of the sealing engagement of FIG. 3.
Figure 5:
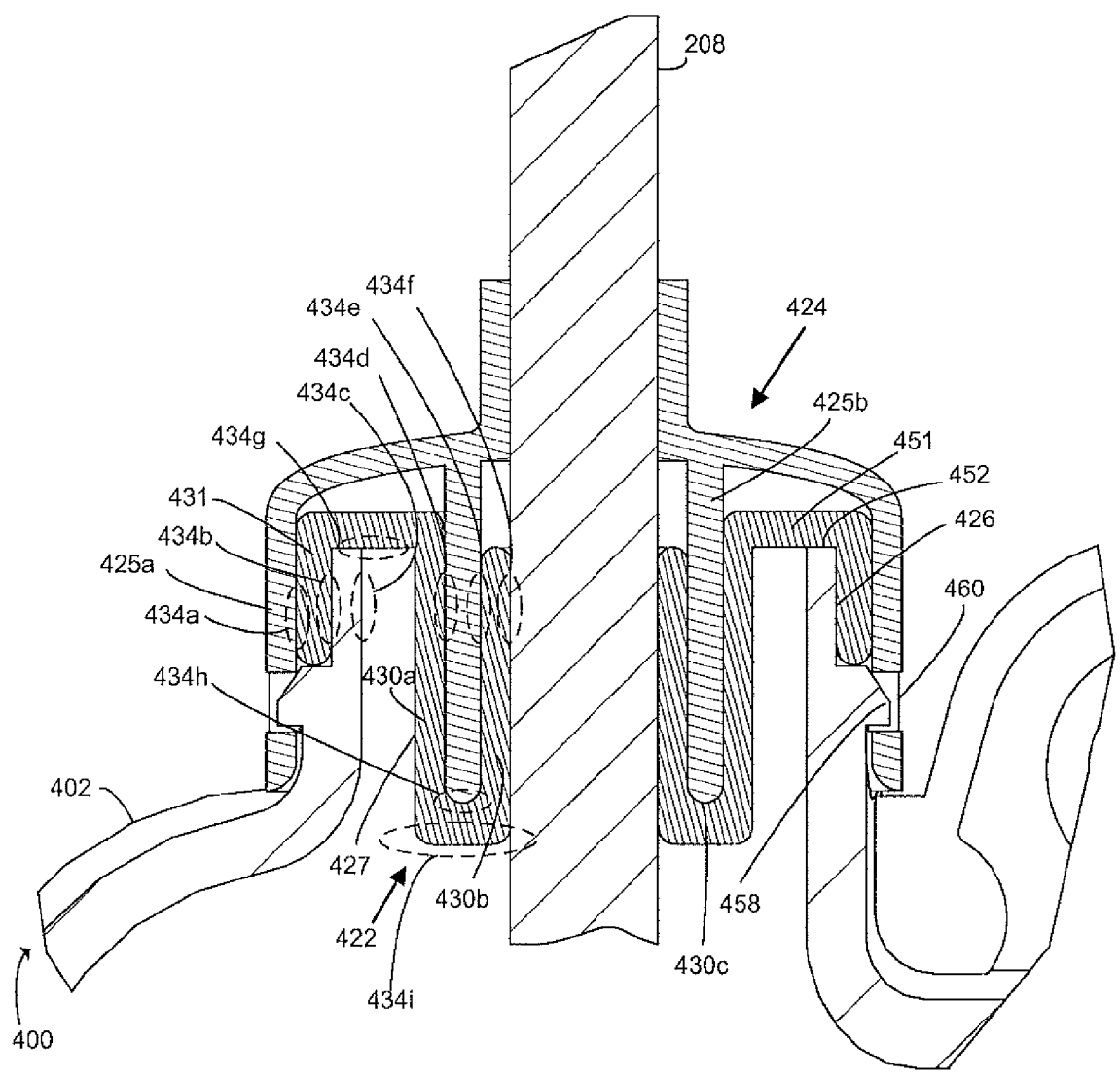
FIG. 5 illustrates a cross-sectional view of the sealing engagement of FIG. 4.

The engagement among the housing 402, sealing member 422 and compression member 424 are specifically detailed in FIGS. 4-5. An upper shoulder 452 and lower shoulder 456 are positioned about the opening 454 for receiving the cable 208 to form a collar wall 426. After an encapsulate material is placed within the housing, the sealing member 422 is positioned such that it rests upon the upper shoulder 452 and lower shoulder 456, such that the outer sealing wall 431 of the sealing member 422 engages the collar wall 426 to provide a sealing engagement therebetween. As the encapsulate material cures, a sealing engagement is also formed between the sealing member 422 and the encapsulate material. For example, encapsulate material cures within the gap 430d bounded by inner collar wall 427 of the sealing member 422, captive portion 451 of the sealing member 422, and collar wall 426 of the housing 402. As such, the encapsulate material forms a sealing engagement between each of these elements.

As discussed above, the encapsulate material often deteriorates due to aging and its own exposure to the elements. In effect, the encapsulate material begins to pull away from various areas of the sealing member, cable, and the housing over time. In order to prevent such deterioration, the compression member 424 is placed such that it engages both the sealing member 422 and the housing 402, after the encapsulate material cures. More specifically, the compression member 424 is placed such that its septum wall 425b is placed within the gap 430c formed by the first inner sealing wall 430a and second inner sealing wall 430b of the sealing member 422. The septum wall 425b has a width 'b' greater than the width 'c' of the gap 430c. Accordingly, when the compression member 424 engages the sealing member 422, the septum wall 425b exerts a lateral force at 434d and 434e. This lateral force prevents the encapsulate material from pulling away from the housing at 434c and the cable at 434f during aging.

The compression member 424 may further provide the added benefit of providing a lateral force at 434a. This provides for a better sealing engagement between the sealing member 422 and the collar wall 426 of the housing 402.

In yet another embodiment, the compression member 424 may further provide the added benefit of providing a longitudinal force. This provides for a better sealing engagement between the sealing member 422 and the upper shoulder 452 of the housing 402 at 434g, the lower shoulder 456 of the housing 402 at 434h, and the encapsulate material near the bottom portion of the gap 430c at 434i.

The foregoing description of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and various modifications as are suited to the particular use contemplated. It is intended that the scope of the invention not be limited by the specification, but be defined by the claims set forth below.

We claim:

1. An article for providing a sealing engagement between an electronic component and an encapsulate material, the electronic component extending from the encapsulate material including:
   a housing including at least one opening for receiving the electronic component,
   an encapsulate material disposed in relation to the opening of the housing, a portion of the encapsulate material providing a seal between the housing and the electrical component,
   a sealing member disposed between another portion of the encapsulate material and the housing,
   a compression member disposed in relation to the sealing member and that engages the housing at a location in relation to the opening of the housing, said compression member exerting force onto the sealing member such that the sealing member engages the other portion of the encapsulate material to provide a sealing engagement therebetween, thereby providing a secondary seal between the housing and the electronic component
   wherein the opening of the housing further includes an external shoulder and wherein the compression member further includes an engagement member for engaging the compression member to the external shoulder of the housing, thereby providing an external seal at the opening of the housing.

2. The article of claim 1, wherein the compression member exerts a lateral force onto the sealing member such that the sealing member engages the other portion of the encapsulate material laterally.

3. The article of claim 1, wherein the compression member exerts a longitudinal force onto the sealing member such that the sealing member engages the other portion of the encapsulate material longitudinally.

4. The article of claim 1, wherein the sealing member further engages both the compression member and the housing at a location in relation to the opening of the housing.

5. The article of claim 1, wherein the sealing member is further disposed in relation to the electronic component and wherein the compression member further exerts force onto the sealing member such that the sealing member engages the electronic component to provide a sealing engagement therebetween.

6. The article of claim 1, wherein the compression member further engages the electronic component to provide a sealing engagement therebetween.

7. The article of claim 1, wherein the encapsulate material is a potting material.

8. The article of claim 7, wherein the potting material is selected from the group consisting of an epoxy based material, an urethane based material, a silicone based material, and acrylic based material, and a polyester based material.

9. The article of claim 1, wherein the housing includes a latching member for securing the compression member thereto.

10. The article of claim 1, wherein the electronic component is a cable.

11. The article of claim 1, wherein the housing protects a radio interface unit.

12. The article of claim 11, wherein the radio interface unit communicates with a power system device.

13. The article of claim 12, wherein the electronic component is a cable which communicates with an external antenna to communicate power system data to an RF receiver.

14. The article of claim 11, wherein the electronic component is a cable which communicates with an external antenna.

15. The article of claim 1, wherein the housing protects an internal electronic component in the form of internal electrical circuitry.

16. The article of claim 1, wherein the electronic component is an antenna.

17. A method for providing a sealing engagement between an electronic component and an encapsulate material, including the steps of
   inserting the electronic component into the opening of the housing, filling the housing with an encapsulate material such that the encapsulate material provides a sealing engagement between the electronic component and the housing,
   disposing a sealing member in relation to the encapsulate material such that the sealing member provides a seal between the encapsulate material and the housing,
   exerting force onto the sealing member to improve the engagement between the encapsulate material and the electronic component; and
   engaging a compression member to an external shoulder of the housing, thereby providing an external seal at the opening of the housing.

18. The method of claim 17, further comprising exerting a lateral force onto the sealing member such that the sealing member engages a portion of the encapsulate material laterally.

19. The method of claim 17, further comprising exerting a longitudinal force onto the sealing member such that the sealing member engages a portion of the encapsulate material longitudinally.

20. The method of claim 18, wherein the encapsulate material is a potting material.

21. The method of claim 17, wherein the electronic component is a cable.

22. The method of claim 17, further comprising disposing the compression member in relation to the sealing member for exerting force onto the sealing member.

* * * * *